8/5/86 OR 4,604,543

United States Patent [19]
Umemura et al.
[11] Patent Number: 4,604,543
[45] Date of Patent: Aug. 5, 1986

[54] MULTI-ELEMENT ULTRASONIC TRANSDUCER

[75] Inventors: Shinichiro Umemura, Hachiouji; Hiroshi Takeuchi, Matsudo; Kageyoshi Katakura, Meguro; Ryuichi Shinomura, Kokubunji, all of Japan

[73] Assignees: Hitachi, Ltd.; Hitachi Medical Corporation, both of Tokyo, Japan

[21] Appl. No.: 676,314

[22] Filed: Nov. 29, 1984

[51] Int. Cl.[4] .......... H01L 41/08
[52] U.S. Cl. .......... 310/334; 310/358; 310/359; 310/366
[58] Field of Search .......... 310/334-336, 310/320, 366, 357-359

[56] References Cited

U.S. PATENT DOCUMENTS

| | | | |
|---|---|---|---|
| 2,262,966 | 11/1941 | Rohde | 310/366 |
| 2,306,909 | 12/1942 | Sykes | 310/366 X |
| 3,656,180 | 4/1972 | Braun | 310/320 X |
| 3,739,304 | 6/1973 | Braun | 310/320 X |
| 4,406,967 | 9/1983 | Obara et al. | 310/366 |
| 4,424,465 | 1/1984 | Ohigashi et al. | 310/366 X |
| 4,473,769 | 9/1984 | Nguyen | 310/366 X |

*Primary Examiner*—Mark O. Budd
*Attorney, Agent, or Firm*—Antonelli, Terry & Wands

[57] ABSTRACT

A multi-element ultrasonic transducer in which elements are arrayed and in which a plate-shaped piezoelectric material has its one face formed with a uniform electrode and its other face formed alternately with electrodes corresponding to the respective elements and electrodes for separating the elements. These electrodes for the element separation are connected the uniform electrode opposed thereto and is fed with a ground potential. On the other hand, the electrodes corresponding to the respective elements are fed individually with transmitting and receiving signals independently of the elements so that the electronic scanning or focusing operations can be achieved.

18 Claims, 11 Drawing Figures

MULTI-ELEMENT ULTRASONIC TRANSDUCER

BACKGROUND OF THE INVENTION

The present invention relates to a multi-element ultrasonic transducer for use in an ultrasonic diagnosis system or an ultrasonic treating system.

A multi-element ultrasonic transducer capable of electronic scanning or focusing has such a construction that a plurality of independently operable elements are arrayed. A representative one of the transducers of this kind is composed of an array of elements by dicing a plate-shaped piezoelectric material which has been poled uniformly in a thickness direction, into a plurality of thin elements and by attaching electrodes to the fronts and backs of the thin elements.

In recent years, however, the spatial resolution required for the ultrasonic inspection or measurement advances to the higher and higher level so that the dicing technique required is approaching to the limit. For the high resolution, the ultrasonic frequency has to be made high, or the aperture to be used for transmission or reception of the ultrasonic waves has to be enlarged. In either event, these elements have to be narrowed, which raises a serious problem in dicing operation of the piezoelectric material.

In ULTRASONICS, November 1979, pp. 255–260, on the other hand, there is disclosed a transducer in which electrodes on the surface of a plate-shaped piezoelectric material are disposed separately of one another and in which elements are substantially arrayed without dicing the piezoelectric material. However, the transducer thus fabricated is not desirable as one for the electronic scanning or focusing because a cross talk between the elements is high due to the coupling of the elements.

SUMMARY OF THE INVENTION

An object of the present invention is to provide a multi-element ultrasonic transducer in which the cross talk between the elements is reduced.

Another object of the present invention is to provide a multi-element ultrasonic transducer which keeps an ultrasonic beam generated out of any grating lobe.

According to one feature of the present invention, there is provided a transducer which comprises: a plate- or sheet-shaped piezoelectric material; a first electrode formed on a first face of said piezoelectric material; second electrodes formed separately of one another for respective elements on a second face of said piezoelectric material opposed to said first face; and third electrodes formed between the gaps between said second electrodes such that said first electrode and said third electrodes are used as a common electrode whereas said second electrodes are used as signal electrodes independent for the respective elements.

According to another feature of the present invention, the transducer is constructed such that first portions between the first electrode and the second electrodes of said piezoelectric material are poled generally in a thickness direction whereas second portions of said piezoelectric material corresponding to the gap positions of said second electrodes have different direction and intensity of polarization from those of said first portions.

According to still another feature of the present invention, the transducer is constructed such that the second face of said piezoelectric material is used for transmitting and receiving the ultrasonic waves.

DESCRIPTION OF THE PREFERRED EMBODIMENTS

Figure 1:
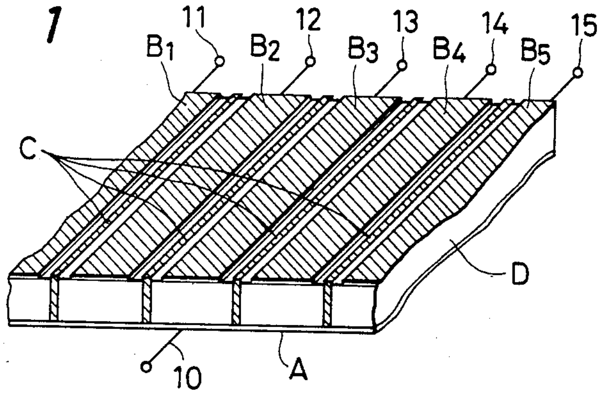
FIGS. 1 to 4 are a perspective view and sectional views showing one embodiment of the present invention.

FIG. 1 shows the construction of a portion of the piezoelectric material of the embodiment of the ultrasonic transducer according to the present invention. The ultrasonic transducer is constructed such that a plate-shaped piezoelectric material D is formed on its back uniformly with an electrode A and on its front with both a number of electrodes $B_1$, $B_2$, $B_3$, $B_4$, $B_5$ and so on, which are divided in an independently drivable manner, and electrodes C which is shaped to isolate the electrodes $B_1$, $B_2$, $B_3$, $B_4$, $B_5$ and so on. The electrode A and the electrodes C are connected at the side of the piezoelectric material D, and a terminal 10 coupled electrically with those electrodes is connected with a common potential (e.g., the ground) of a signal to be transmitted or received by the transducer. On the other hand, terminals 11, 12, 13, 14 and 15 are coupled to the electrodes $B_1$, $B_2$, $B_3$, $B_4$, $B_5$, respectively, and are to be fed with the independent transmitted or received signals of the respective elements of the transducer, respectively.

The piezoelectric material D is made of ceramics of PZT (i.e., zircon lead titanate: $P_2(ZrTi)O_3$) or lead titanate ($PbTiO_3$) having a uniform polarization in the thickness direction.

Figure 2:
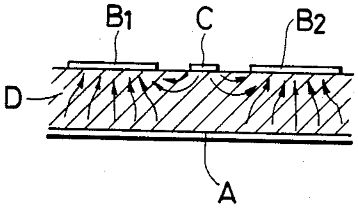
Figure 3:
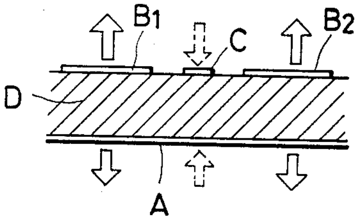

The operations of this piezoelectric material D are shown in FIGS. 2 and 3.

Now, let the case be considered, in which an electric signal in phase is applied to the electrodes $B_1$ and $B_2$. The distribution of lines of electric force in the piezoelectric material at that time is indicated by arrows in FIG. 2. The directions of the displacement, which are resultantly generated in the piezoelectric material, are schematically shown by arrows in FIG. 3.

Thus, according to the piezoelectric material having the construction shown in FIG. 1, the electrodes C and the electrode A are always held at the same potential so that they operate to isolate the lines of electric force which are generated by applying an electric signal to the adjoining electrodes $B_1$ and $B_2$. As a result, the electrodes C have a function to weaken the coupling the elements corresponding to the electrodes $B_1$ and $B_2$, respectively. Thus, it is possible to provide the multi-element ultrasonic transducer having little cross talk.

Figure 4:
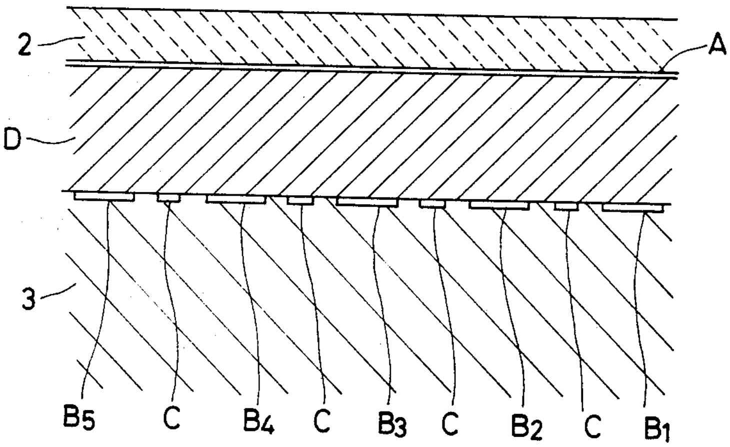

FIG. 4 is a sectional view showing the overall construction of the ultrasonic transducer using the portion of the piezoelectric material shown in FIG. 1. An acoustic matching layer 2 of epoxy resin or the like is formed at that side of the piezoelectric material D, which is formed with the electrode A. On the other hand, the other side formed with the electrodes C and the electrodes $B_1$, $B_2$, $B_3$, $B_4$, $B_5$ is fixed to a stationary end through a backing material 3. In other words, the side formed with the electrode A is used for transmission and reception of sound waves.

Figure 5:
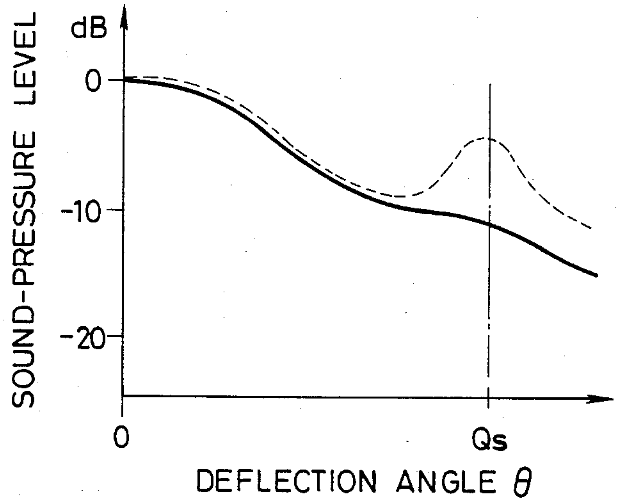
FIG. 5 is a directive diagram showing the embodiment of FIG. 4.

FIG. 5 is a directive diagram showing a sound beam in case the transducer of the embodiment shown in FIG. 4 is operated by applying a signal only to the electrode $B_3$. Broken curve appearing in FIG. 5 indicates the directivity of a sound beam in case the piezoelectric material D is used in a direction opposite to that of the embodiment of FIG. 4, i.e., in case the side formed with the electrodes electrodes $B_1$, $B_2$, $B_3$, $B_4$, $B_5$ and the electrodes C is used as the face for transmitting and receiving the sound waves. From this Figure, it is found that the side lobe generated at a deflection angle $\theta_s$ is weakened by the side lobe generated in the transducer which uses the piezoelectric material shown by the broken curve is used in the direction opposite to that having the construction of FIG. 4 shown by solid curve. The side lobe is thought to be generated by waves such as the surface waves which are propagated transversely along a surface of the piezoelectric material. As a result, there can be attained an effect that the unwanted response by those surface waves is weakened by using the side of the electrode A as the sound wave transmitting and receiving face, as shown in FIG. 4.

The embodiment thus far described uses as the piezoelectric material the material which is poled uniformly in the thickness direction. On the other hand, the lines of electric force generated in the vicinity of the electrodes C are reversed, as shown in FIG. 2, from those which are generated at the positions corresponding to the electrodes $B_1$ and $B_2$. As a result, as shown by broken arrows in FIG. 3, there are generated at a portion corresponding to the electrode $C_1$ the stresses which are reversed from those at the portions corresponding to the electrodes $B_1$ and $B_2$. This stress distribution raises a cause for intensifying the grating lobe of the ultrasonic beam. This problem is solved by the embodiments shown in FIGS. 6 to 9.

Figure 6:
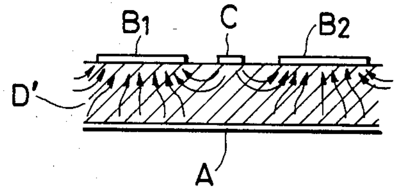
FIGS. 6 and 7 are sectional views showing a portion of another embodiment of the present invention.

First of all, in the embodiment shown in FIG. 6, the polarization of a piezoelectric material D' is effected in the directions indicated by arrows in FIG. 6. More specifically, the polarization is effected generally in the thickness direction at the portions corresponding to the electrodes $B_1$ and $B_2$. At the region corresponding to the gap between the electrodes $B_1$ and $B_2$, the polarization is effected in the directions from the electrode C to the adjoining electrodes $B_1$ and $B_2$. In other words, the polarization is effected in the directions of the arrows shown in FIG. 2, that is to say, in the directions along the directions of the electric field lines in the piezoelectric material when signals in phase are applied to the electrodes $B_1$ and $B_2$.

The piezoelectric material D' having such special polarization distribution can be fabricated by forming the electrode A, the electrodes $B_1$, $B_2$ and so on, and the electrodes C prior to the poling treatment, by making the electrodes A and C common to provide one polarization, by connecting commonly the electrodes $B_1$, $B_2$ and so on and applying a high voltage to provide the other polarization, and by conducting the poling treatment. According to another method, on the other hand, a piezoelectric material having a polarization distribution substantially similar to that of the piezoelectric device D' shown in FIG. 6 can be obtained by forming the electrodes $B_1$, $B_2$ and so on and the electrodes C on a piezoelectric device having a polarization uniform in the thickness direction, by applying a high voltage between the electrodes $B_1$, $B_2$ and so on and the electrodes C to conduct the poling treatment again. Incidentally, the direction of polarization may naturally be reversed from the direction indicated by the arrows in FIG. 6. In other words, the polarization of the voltage to be applied between the electrode A and the electrodes C and $B_1$, $B_2$ and so on.

The piezoelectric material D' thus fabricated to have the special polarization distribution is used in the multielement ultrasonic transducer by absolutely the same method as that of the piezoelectric material D shown in FIGS. 1 to 4. For use, specifically, the electrode A and the electrodes C are connected commonly to provide the electrode for the common signal (e.g., the ground), whereas the electrodes $B_1$, $B_2$ and so on are used as the electrodes of the independent elements of the transducer for transmitting and receiving signals, respectively. Moreover, the unwanted response due to the influence of the surface waves can be reduced by using the side formed with the electrode A as the sound wave transmitting and receiving face. In this case, an acoustic matching layer may be further formed on the electrode A whereas a backing material may also be formed on the electrodes $B_1$, $B_2$ and so on and the electrodes C.

Figure 7:
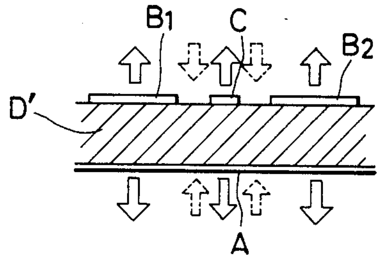

FIG. 7 shows the stress distribution of the piezoelectric material D' in case signals in phase are applied to the electrodes $B_1$ and $B_2$. As is different from the piezoelectric material D shown in FIG. 3, the directions of the stress at the positions corresponding to the electrodes C are aligned with those of the stress at the positions corresponding to the electrodes $B_l$ and $B_2$. As a result, the transducer using the piezoelectric material D' has effects that the grating lobe of the ultrasonic beam is weakened, and that the transmission and reception sensitivities are improved.

Figure 8:
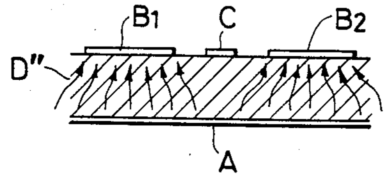
FIGS. 8 and 9 are sectional views showing a portion still another embodiment of the present invention.
Figure 9:
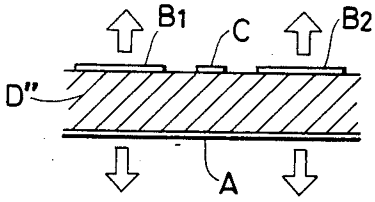

In a piezoelectric material D'' shown in FIG. 8, on the other hand, only the portions corresponding to the electrodes $B_1$ and $B_2$ are polarized generally in the thickness direction, and the portions corresponding to the electrodes C are left non-polarized. This piezoelectric material D'' can be fabricated by forming the electrode A and the electrodes $B_1$, $B_2$ and so on on an unpoled piezoelectric material, by applying a high voltage between the electrode A and the electrodes $B_1$, $B_2$ and so on to effect the poling treatment, and subsequently by forming the electrodes between the electrodes $B_l$, $B_2$ and so on. The piezoelectric material D'' thus fabricated is used in the multielement ultrasonic transducer in absolutely the same manner as that of the piezoelectric material shown in FIGS. 1 to 4. The stress distribution when signals in phase are applied to the electrodes $B_1$ and $B_2$ of the piezoelectric material D'' is shown by arrows in FIG. 9, from which it is found that no stress is established in the portions corresponding to the electrodes C. As shown, the grating lobe of the ultrasonic beam is less than in the transducer using the piezoelectric material D of FIG. 1. Still moreover, the transverse polarization between the portions of the electrodes $B_1$, $B_2$ and so on and the electrodes C of the piezoelectric material D' of FIG. 6 is not established in the piezoelectric material D'' of FIG. 8. As a result, in case such a piezoelectric material having a large electro-mechanical coupling coefficient $k_{31}$ in direction perpendicular to the poling direction and a negative piezoelectric constant as is represented by ceramics of zircon lead titanate is used, the piezoelectric material D'' having the polarization distribution of FIG. 8 exhibits more excellent characteristics than those of the piezoelectric material D′ having the polarization distribution of FIG. 6. This is because, in case the polarization of FIG. 6 is conducted to drive the electrodes $B_1$ and $B_2$ with signals in phase by using a piezoelectric material having a large electro-mechanical coupling coefficient $k_{31}$, stresses having directions opposite to those of the regions corresponding to the electrodes $B_1$ and $B_2$ and the electrode $C_1$, as shown by broken arrows in FIG. 7, are generated by the transverse polarization in the regions between the electrodes $B_1$ and D and between the electrodes $B_2$ and C thereby to cause the grating lobe.

In the multi-element transducer using no dicing technique, as has been exemplified in the foregoing embodiments, the electrodes C are formed between the electrodes $B_1$, $B_2$ and so on corresponding to the respective elements so that the electrical coupling between the elements may be prevented. Despite of this fact, incidentally, the coupling between the elements is caused not only by the electrical coupling but also the coupling, which comes from the sound waves propagating transversely in the piezoelectric material, and the latter coupling may cause an unwanted response. In order to reduce unwanted response due to the coupling caused by the surface waves, it is effective to form shallow grooves at a suitable interval in that side of the piezoelectric material D, D′ or D″, which is formed with the electrode A.

Figure 10:
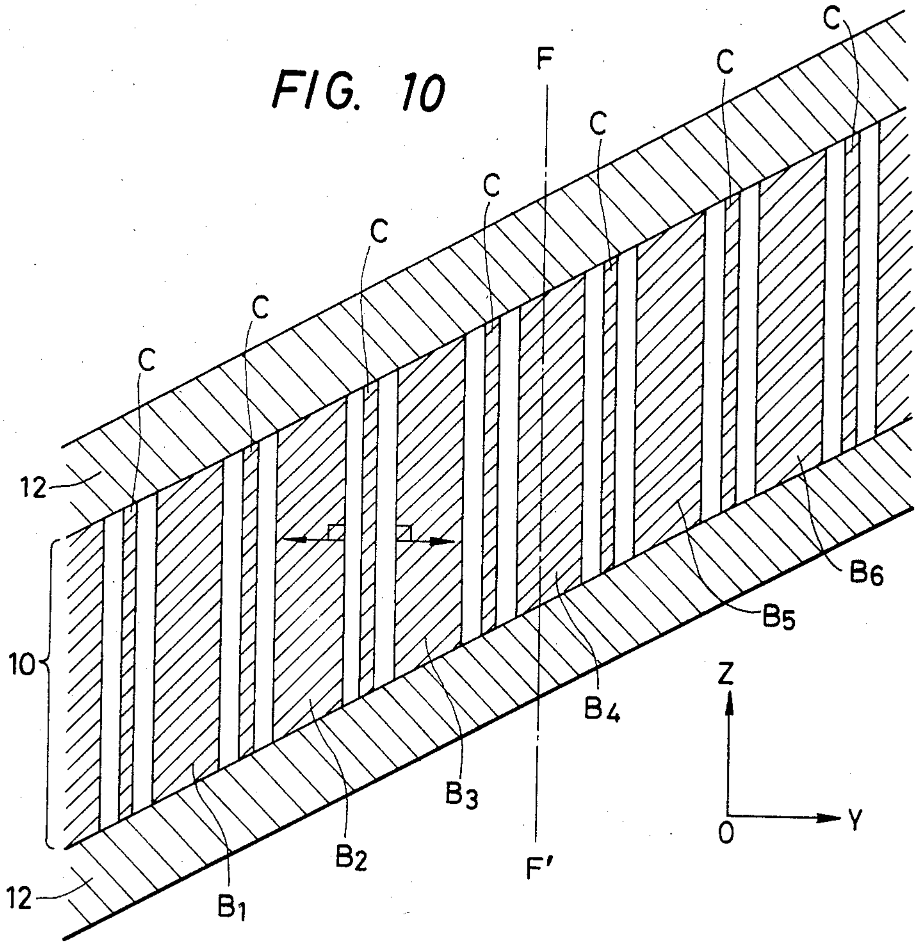
FIGS. 10 and 11 are a top plan view and a sectional view showing a further embodiment of the present invention.
Figure 11:
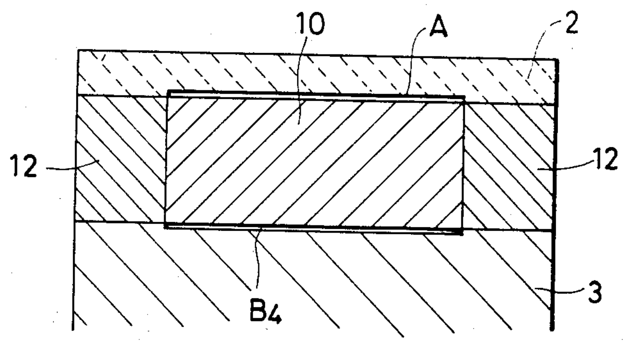

Another example for reducing the influences of the surface waves is shown in FIGS. 10 and 11. FIG. 10 is a top plan view taken from the lower face of a transducer before covered with a backing member. This embodiment is similar to the foregoing ones in that the electrodes $B_1$, $B_2$, $B_3$, $B_4$, $B_5$, $B_6$ and so on corresponding to the elements and the electrodes C connected with a common signal are formed alternately on the surface of the piezoelectric material 10, but is different therefrom in that the normal lines of the boundaries dividing those electrodes are not in parallel with but inclined with respect to the side face of the rectangular piezoelectric material 10. This piezoelectric material 10 has both its side faces covered with a sound-absorptive member 12 which is made of such a material as is prepared by dispersing metal powder or hollow glass particles in rubber, for example. FIG. 11 is a sectional view taken along line F—F of FIG. 10. The electrode A formed on the surface of the piezoelectric material 10 is further formed thereon with an acoustic matching layer 2. On the other hand, that face of the piezoelectric material, which is formed with the electrodes $B_1$, $B_2$ and so on and the electrodes C, is fixed to a not-shown stationary end through a backing member 3. The piezoelectric material 10 may be exemplified by any of that having the uniform polarization, as shown in FIG. 1, and those having the special polarization distributions, as shown in FIGS. 6 and 8.

According to the present embodiment, the sound waves caused to propagate transversely in the piezoelectric material by the operations of the special elements are highly attenuated to reduce the unnecessary response due to themselves. This is because, although the sound waves will propagate mainly in the directions perpendicular to the boundaries of the electrodes $B_1$, $B_2$ and so on, i.e., in the direction Z of FIG. 10, they are absorbed effectively in the present embodiment by the sound-absorptive material 12 covering the sides of the piezoelectric material.

What is claimed is:

1. A multi-element ultrasonic transducer for at least one of transmission and reception of sound waves comprising:
   - a piezoelectric material having a plate or sheet shape;
   - a first electrode formed on a first face of said piezoelectric material;
   - a plurality of second electrodes formed on a second face of said piezoelectric material opposite to said first face such that they are separated from one another in a manner to correspond to the plural elements of said transducer; and
   - a plurality of third electrodes formed on the second face of said piezoelectric material and in the gaps between said second electrodes,
   - wherein said first electrode and said third electrodes are used as a common electrode whereas said second electrodes are used as the signal electrodes for said elements, respectively.
2. A multi-element ultrasonic transducer according to claim 1, wherein the first face of said piezoelectric material is used as one for transmitting and receiving sound waves.
3. A multi-element ultrasonic transducer according to claim 1, wherein said piezoelectric material has a polarization uniform in its thickness direction.
4. A multi-element ultrasonic transducer comprising:
   - a piezoelectric material having a plate or sheet shape;
   - a first electrode formed on a first face of said piezoelectric material;
   - a plurality of second electrodes formed on a second face of said piezoelectric material opposite to said first face such that they are separated from one another in a manner to correspond to the plural elements of said transducer; and
   - a plurality of third electrodes formed on the second face of said piezoelectric material and in the gaps between said second electrodes,
   - wherein said first electrode and said third electrodes are used as a common electrode whereas said second electrodes are used as the signal electrodes for said elements, respectively, and
   - wherein said piezoelectric material has polarizations in both the direction from said first electrode to said second electrodes and the direction from the adjacent ones of said third electrodes to said second electrodes.
5. A multi-element ultrasonic transducer comprising:
   - a piezoelectric material having a plate or sheet shape;
   - a first electrode formed on a first face of said piezoelectric material;
   - a plurality of second electrodes formed on a second face of said piezoelectric material opposite to said first face such that they are separated from one another in a manner to correspond to the plural elements of said transducer; and
   - a plurality of third electrodes formed on the second face of said piezoelectric material and in the gaps between said second electrodes,
   - wherein said first electrode and said third electrodes are used as a common electrode whereas said second electrodes are used as the signal electrodes for said elements, respectively, and
   - wherein said piezoelectric material has such polarizations along the directions of electric field lines to be generated therein in case voltages are applied to said first, second and third electrodes such that said first electrode and said third electrodes take a first polarity whereas said second electrodes take a second polarity.

6. A multi-element ultrasonic transducer comprising:
a piezoelectric material having a plate or sheet shape;
a first electrode formed on a first face of said piezoelectric material;
a plurality of second electrodes formed on a second face of said piezoelectric material opposite to said first face such that they are separated from one another in a manner to correspond to the plural elements of said transducer; and
a plurality of third electrodes formed on the second face of said piezoelectric material and in the gaps between said second electrodes,
wherein said first electrode and said third electrodes are used as a common electrode whereas said second electrodes are used as the signal electrodes for said elements, respectively, and
wherein those portions of said piezoelectric material, which are formed with said second electrodes, have a polarization generally in the thickness direction whereas the portions formed with said third electrodes are non-polarized.

7. A multi-element ultrasonic transducer comprising:
piezoelectric material having a plate or sheet shape;
a first electrode formed on a first face of said piezoelectric material;
a plurality of second electrodes formed on a second face of said piezoelectric material opposite to said first face such that they are separated from one another in a manner to correspond to the plural elements of said transducer; and
a plurality of third electrodes formed on the second face of said piezoelectric material and in the gaps between said second electrodes,
wherein said first electrode and said third electrodes are used as a common electrode whereas said second electrodes are used as the signal electrodes for said elements, respectively, and
wherein the perpendicular lines of the boundary lines of said second and third electrodes are inclined with respect to the sides of said piezoelectric material.

8. A multi-element ultrasonic transducer according to claim 7, further comprising a sound-absorptive member covering the sides of said piezoelectric material.

9. A multi-element ultrasonic transducer comprising:
a piezoelectric material having a plate or sheet shape;
a first electrode formed on a first side of said piezoelectric material;
a plurality of second electrodes formed on a second face of said piezoelectric material opposite to said first face such that they are separate of one another in a manner to correspond to the plural elements of said transducer; and a plurality of third electrodes formed on the second face of said piezoelectric material and in the gaps between said second electrodes,
wherein said first electrode and said third electrodes are used as a common electrode whereas said second electrodes are used as the signal electrodes for said elements, respectively, and wherein said first face is used for transmitting and receiving sound waves.

10. A multi-element ultrasonic transducer according to claim 9, wherein said first electrode and said third electrodes are connected with the side faces of said piezoelectric material.

11. A multi-element ultrasonic transducer according to claim 9, further comprising an acoustic matching layer formed on said first electrode.

12. A multi-element ultrasonic transducer according to claim 9, further comprising a backing member formed on said second and third electrodes.

13. A multi-element ultrasonic transducer according to claim 9, wherein said piezoelectric material is polarized uniformly in the thickness direction thereof.

14. A multi-element ultrasonic transducer according to claim 9, wherein those portions of said piezoelectric material, which correspond to the positions of said second electrodes, have polarizations generally in the thickness directions thereof whereas those portions corresponding to the positions of said third electrodes have polarizations which are different in directions and intensities from those of the portions corresponding to said second electrodes.

15. A multi-element ultrasonic transducer according to claim 9, wherein said piezoelectric material is polarized in both the directions from said first electrode to said second electrodes and the directions from the adjacent ones of said second electrodes to said third electrodes.

16. A multi-element ultrasonic transducer according to claim 9, wherein said piezoelectric material is polarized in the directions along the electric feild lines to be generated therein in case voltages are applied to said first, second and third electrodes such that said first electrode and said third electrodes have a first polarity whereas said second electrodes have a second polarity.

17. A multi-element ultrasonic transducer according to claim 9, wherein those portions of said piezoelectric material, which are formed with said second electrodes, are polarized generally in the thickness directions thereof whereas the portions formed with said third electrodes are made non-polarized.

18. A multi-element ultrasonic transducer according to claim 1, wherein each of the elements of the multi-element ultrasonic transducer enables at least one of transmission of sound waves from said piezoelectric material and reception of sound waves from outside of said piezoelectric material through displacement of at least one of said first and second faces along the thickness direction of said piezoelectric material.

* * * * *